(12) United States Patent
Cheng et al.

(10) Patent No.: US 6,187,694 B1
(45) Date of Patent: Feb. 13, 2001

(54) METHOD OF FABRICATING A FEATURE IN AN INTEGRATED CIRCUIT USING TWO EDGE DEFINITION LAYERS AND A SPACER

(75) Inventors: Peng Cheng, Campbell; Brian S. Doyle, Cupertino, both of CA (US)

(73) Assignee: Intel Corporation, Santa Clara, CA (US)

(*) Notice: Under 35 U.S.C. 154(b), the term of this patent shall be extended for 0 days.

(21) Appl. No.: 08/969,008

(22) Filed: Nov. 10, 1997

(51) Int. Cl.$^7$ .................................................. H01L 21/265
(52) U.S. Cl. ........................... 438/947; 438/450; 438/251
(58) Field of Search .................... 437/40, 27, 28, 437/29, 38, 39; 257/77; 438/947, 286, 585, 596, 587, 592, 296, 586, 300

(56) References Cited

U.S. PATENT DOCUMENTS

| | | | |
|---|---|---|---|
| 4,744,859 | * 5/1988 | Hu et al. | 156/643 |
| 5,466,615 | * 11/1995 | Tsai | 437/31 |
| 5,494,837 | * 2/1996 | Subramanian et al. | 437/34 |
| 5,496,756 | * 3/1996 | Sharma et al. | 437/52 |
| 5,510,281 | * 4/1996 | Ghezzo et al. | 437/41 |
| 5,610,099 | * 3/1997 | Stevens et al. | 437/192 |

OTHER PUBLICATIONS

Stanley Wolf and Richard Tauber, Silicon Processing for hte VLSI Era vol. 1, pp. 522–523, 1986.*

J.T. Horstmann, et al.; "Characterizzation of Sub–100 nm–MOS–Transistors Processed by Optical Lithography and a Sidewall–Etchback Technique"; Faculty of Electrical Engineering, University of Dortmund, Emil–Frigge–Str. 68, D 44221 Dortmun, Germany; 4 pages total.

* cited by examiner

*Primary Examiner*—Charles Bowers
*Assistant Examiner*—Laura M Schillinger
(74) *Attorney, Agent, or Firm*—Robert G. Winkle

(57) ABSTRACT

A method of fabricating a feature on a substrate is disclosed. In a described embodiment the feature is the gate electrode of an MOS transistor. In this embodiment a polysilicon layer is formed on the substrate. Next, an edge definition layer of silicon nitride is formed on the feature layer. Then, a patterned edge definition layer of silicon dioxide is formed on the first edge definition layer. Then, a silicon nitride spacer is formed adjacent to an edge of the patterned second edge definition layer. Finally, the polysilicon layer is etched, forming the transistor gate electrode from the polysilicon that remains under the spacer.

18 Claims, 10 Drawing Sheets

METHOD OF FABRICATING A FEATURE IN AN INTEGRATED CIRCUIT USING TWO EDGE DEFINITION LAYERS AND A SPACER

FIELD OF THE INVENTION

The present invention relates to the field of semiconductor processing and more particularly to a method of fabricating a feature in an integrated circuit.

BACKGROUND OF THE INVENTION

A desire to increase the speed and density of integrated circuits (ICs) has led to progressive reductions in feature dimensions, particularly in the lengths of Metal-Oxide-Semiconductor (MOS) transistor gate electrode. However, the reduction in feature dimensions is limited by a need to provide some margin for process variation, which is responsible for a difference between the target dimension and the minimum actual dimension typically yielded by the fabrication process. For example, given the process variation of conventional photolithography, it is difficult to manufacture MOS transistor gate electrodes with a target dimension of less than 250 nm using conventional photolithography to define the target dimension. To overcome this difficulty, a process of gate definition referred to as "Spacer Gate" or "SG" has been developed.

An example of an SG process flow on a semiconductor wafer is illustrated in FIGS. 1a through 1g, each of which represent a cross sectional view of the wafer. FIG. 1a shows a silicon substrate 101. A gate oxide layer 102 has been formed on silicon substrate 101. A polysilicon layer 103 has been formed on gate oxide layer 102. The gate electrode of the future MOS transistor will be formed from polysilicon layer 103.

FIG. 1b shows an area 104 of a silicon dioxide edge definition layer. Edge definition area 104 has been formed by patterning a layer of silicon dioxide using conventional photolithography and etch. The patterning of edge definition area 104 constitutes the first masking step of this SG process. FIG. 1c shows a silicon nitride spacer layer 105 that has been formed on the wafer. FIG. 1d shows silicon nitride spacers 106 and 107 that have been formed on the edge of edge definition area 104 by an anisotropic etch of spacer layer 105. FIG. 1e shows the wafer after edge definition area 104 has been etched away.

In FIG. 1e, spacers 106 and 107 remain on the wafer, as part of a continuous ring of silicon nitride that was formed around the entire edge of edge definition area 104. Since the area of gate electrode layer 103 that is covered by silicon nitride will not be subsequently removed, but the desired pattern of the gate electrode is not a continuous ring, a portion of the silicon nitride ring must be removed. The removal of a portion of the silicon nitride ring is referred to as nitride trim, which constitutes the second masking step of this SG process. In FIG. 1e, spacer 106 covers an area of polysilicon layer 103 that will become a portion of a gate electrode, but spacer 107 represents a portion of the spacer ring that must be trimmed. Figure 1f shows spacer 106 covered by a photoresist trim mask 108 which is formed by conventional photolithography.

FIG. 1g shows the wafer after spacer 107 has been removed by a trim etch and trim mask 108 has been stripped. The area of polysilicon layer 103 that is under spacer 106 will become a gate electrode with a length that depends on the length 109 of spacer 106. The length 109 of spacer 106 depends the thickness of former spacer layer 105, so only features of the same length as the future gate electrode can be defined with this SG process. Therefore, a third masking step is needed to define features from polysilicon layer 103 that are of greater length than the future gate electrode. Such features might include transistor gate electrodes of greater than minimum length, polysilicon interconnect lines, and polysilicon contact pads. The photoresist mask used for this third masking step is referred to as pad mask.

FIG. 1h shows pad mask 110 masking an area of polysilicon layer 103 that will be protected during polysilicon etch to form a contact pad. FIG. 1i shows gate electrode 111 and contact pad 112 after polysilicon etch. Next, pad mask 110 is stripped. Seal oxide 113, shown in FIG. 1j, is grown to protect the edges of gate electrode 111 during subsequent processing. Finally, FIG. 1k shows the wafer after spacer 106 has been etched away. The remainder of the transistor structure can be formed using conventional MOS processing.

The described method of fabricating a gate electrode using a spacer requires three masking steps. Process complexity and cost are directly related to the number of masking steps. Therefore, a method of fabricating a feature using a spacer and requiring only two masking steps is desired.

SUMMARY OF THE INVENTION

A method of fabricating a feature on a substrate is disclosed. First, a feature layer is formed on the substrate. Next, a first edge definition layer comprising a first material is formed on the feature layer. Then, a patterned second edge definition layer comprising a second material is formed on the first edge definition layer. Then, a spacer is formed adjacent to an edge of the patterned second edge definition layer. Finally, an area of the feature layer that is not under the spacer is etched to form the feature under the spacer.

BRIEF DESCRIPTION OF THE DRAWINGS

FIG. 2i-2 is an illustration of the wafer of FIG. 2a during the trim mask step of an alternative approach.

FIG. 2j-1 is an illustration of the wafer of FIG. 2a after trim etch

FIG. 2j-2 is an illustration of the wafer of FIG. 2a in the flow of the alternative approach after trim etch.

FIG. 2k-1 is an illustration of the wafer of FIG. 2a after an etch of the patterned second EDL.

FIG. 2k-2 is an illustration of the wafer of FIG. 2a in the flow of the alternative approach after an etch of the patterned second EDL.

FIG. 2l-1 is an illustration of the wafer of FIG. 2a after the trim mask has been removed.

FIG. 2l-2 is an illustration of the wafer of FIG. 2a in the flow of an alternative approach after the trim mask has been removed.

DETAILED DESCRIPTION OF A PREFERRED EMBODIMENT

A method of fabricating a feature in an integrated circuit is described. In the following description, numerous specific details are set forth in order to provide a thorough understanding of the present invention. It will be apparent, however, to one skilled in the art that the present invention can be practiced without regard to these specific details. In other instances, well known processes and structures have not been described in particular detail in order to avoid obscuring the present invention. Also, though a description of the fabrication of an MOS gate electrode is described, the present invention can be used to fabricate any feature in an integrated circuit.

FIGS. 2a through 2k depict an embodiment of the invention that is a process of fabricating an MOS transistor gate electrode on a semiconductor wafer. Each of FIGS. 2a through 2k illustrate a cross sectional view of the wafer. The process represented by FIGS. 2a through 2k involves the formation of a silicon nitride spacer on a polysilicon layer. The process includes the formation of two edge definition layers, the latter of which is patterned to provide an edge on which to form the spacer. The spacer is formed by conformally depositing, then anisotropically etching a spacer layer. The spacer is used to define a feature in the polysilicon layer by protecting the polysilicon underneath the spacer during a subsequent polysilicon etch. In this embodiment the feature is the gate electrode of an MOS transistor. This process includes only two masking steps, demonstrating one advantage of the invention over the related art. However, the invention can also be practiced in a process that uses a different number of masking steps.

Figure 1A:
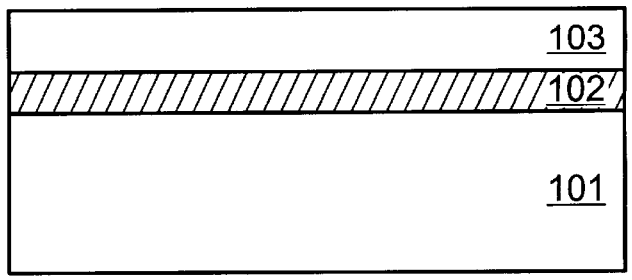
FIG. 1a is a cross sectional illustration of a semiconductor wafer upon which a feature will be formed according to a known spacer gate process.
Figure 1B:
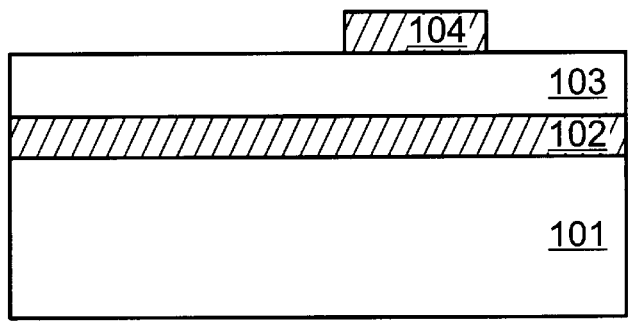
FIG. 1b is an illustration of the wafer of FIG. 1a after an edge definition layer (EDL) has been formed.
Figure 1C:
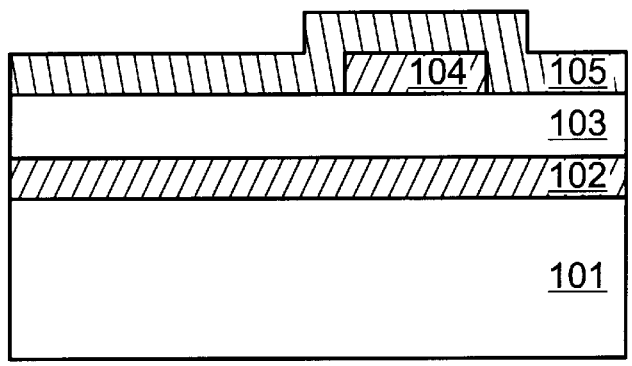
FIG. 1c is an illustration of the wafer of FIG. 1a after a spacer layer has been formed.
Figure 1D:
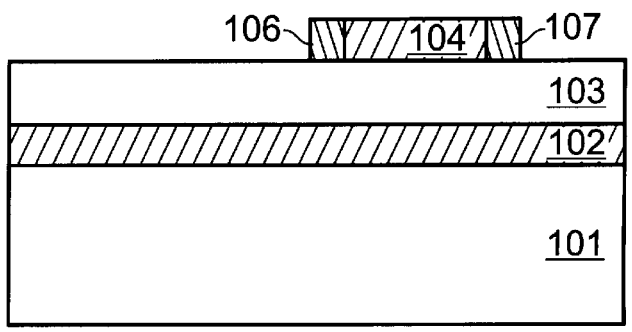
FIG. 1d is an illustration of the wafer of FIG. 1a after spacers have been formed.
Figure 1E:
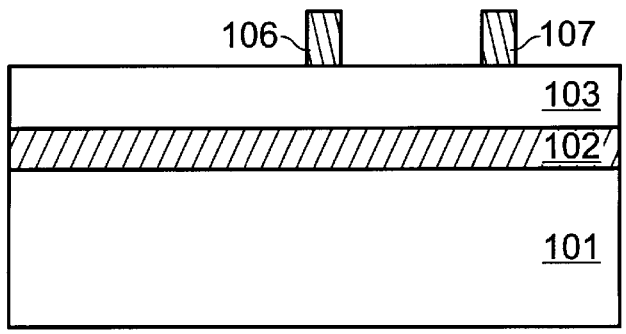
FIG. 1e is an illustration of the wafer of FIG. 1a after the EDL has been etched away.
Figure 1F:
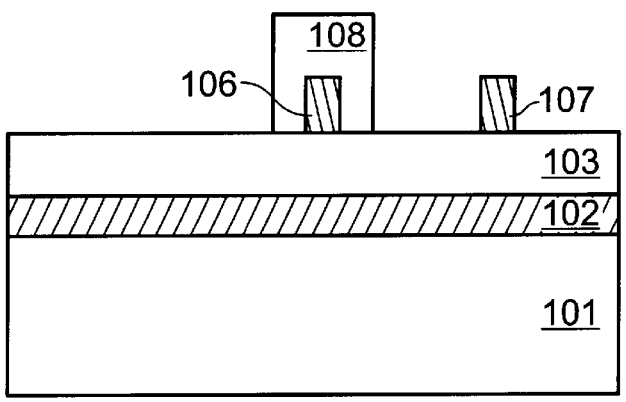
FIG. 1f is an illustration of the wafer of FIG. 1a during the trim mask step.
Figure 1G:
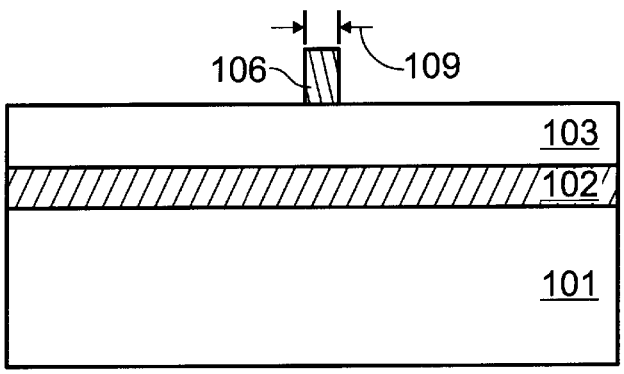
FIG. 1g is an illustration of the wafer of FIG. 1a after trim etch.
Figure 1H:
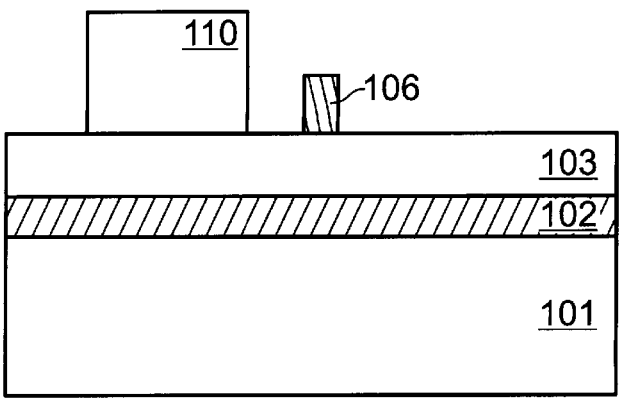
FIG. 1h is an illustration of the wafer of FIG. 1a during the pad mask step.
Figure 1I:
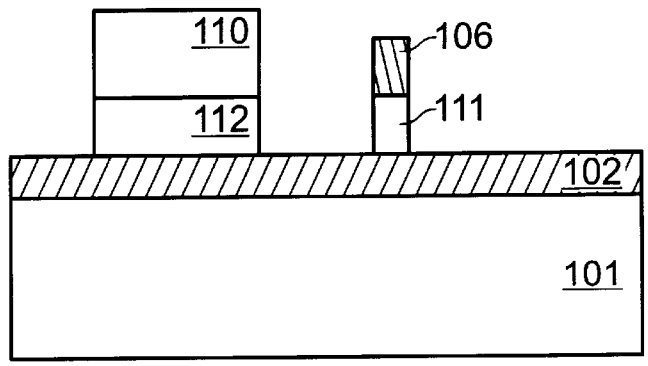
FIG. 1i is an illustration of the wafer of FIG. 1a after polysilicon etch.
Figure 1J:
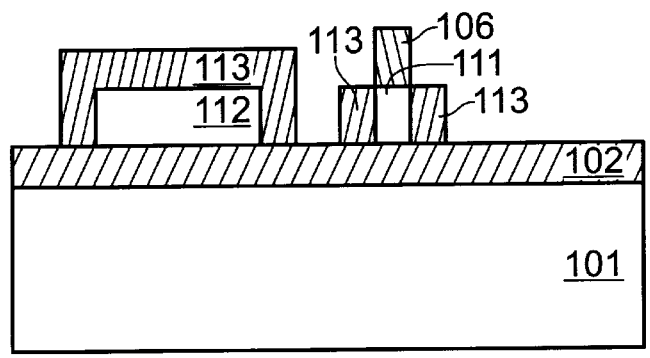
FIG. 1j is an illustration of the wafer of FIG. 1a after a seal oxide is grown.
Figure 1K:
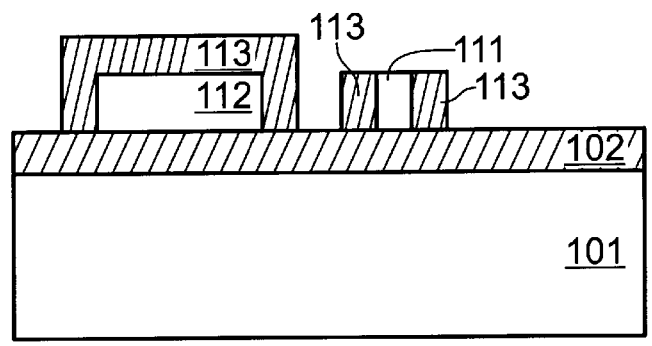
FIG. 1k is an illustration of the wafer of FIG. 1a after the spacer has been etched away.
Figure 2A:
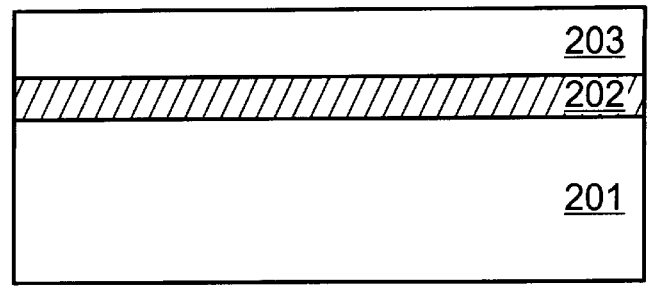
FIG. 2a is a cross sectional illustration of a semiconductor wafer upon which a feature will be formed according to an embodiment of the present invention.

FIG. 2a shows a semiconductor substrate 201. Semiconductor substrate 201 can be silicon, silicon on an insulator, germanium, gallium arsenide, or any other substrate on which integrated circuits can be built. A gate dielectric layer 202 has been formed by any well known technique on semiconductor substrate 201. Gate dielectric layer 202 can comprise silicon dioxide, silicon nitride, lead strontium, barium strontium, aluminum oxide, tantalum pentoxide, or any other dielectric material. Gate dielectric layer 202 is preferably between 2 nm and 5 nm thick. A feature layer 203 has been formed by any well known technique on gate dielectric layer 202. Feature layer 203 can comprise any material from which a feature of an integrated circuit can be made, such as but not limited to conductive materials comprising polysilicon, aluminum, or copper. In this embodiment, feature layer 203 comprises polysilicon, from which the gate electrode of an MOS transistor will be fabricated. Feature layer 203 is preferably between 100 nm and 350 nm thick.

Figure 2B:
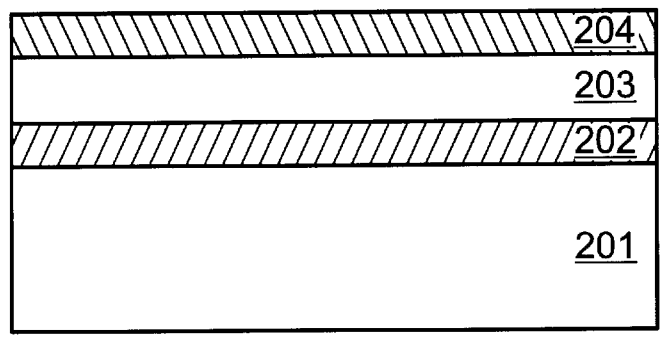
FIG. 2b is an illustration of the wafer of FIG. 2a after a first EDL has been formed.

FIG. 2b shows the wafer after a first edge definition layer (EDL) 204 has been formed by any well known technique. First EDL 204 can comprise any material used in semiconductor processing, such as but not limited to insulating materials comprising silicon nitride or silicon dioxide. In this embodiment, first EDL 204 comprises silicon nitride, and preferably comprises primarily silicon nitride, because silicon nitride is a preferred material for masking a polysilicon etch. First EDL 204 is preferably thick enough to act as a mask for a subsequent etch of feature layer 203, yet not so thick as to unnecessarily increase processing time or cost. The preferred thickness of first edge definition layer 204 is between 100 nm and 300 nm.

Figure 2C:
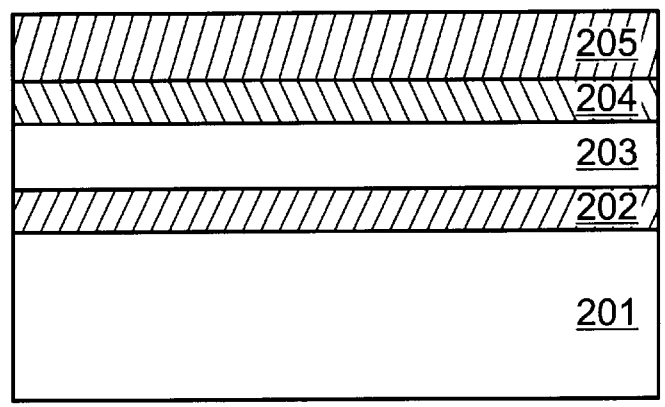
FIG. 2c is an illustration of the wafer of FIG. 2a after a second EDL has been formed.

FIG. 2c shows the wafer after a second EDL 205 has been formed by any well known technique. Second EDL 205 can comprise any material used in semiconductor processing, such as but not limited to insulating materials comprising silicon nitride or silicon dioxide. However, the composition of second EDL 205 is preferably different from the composition of first EDL 204 so that second EDL 205 can be selectively removed. Therefore, in this embodiment, second EDL 205 comprises silicon dioxide, and preferably comprises primarily silicon dioxide. Second EDL 205 is preferably thick enough to subsequently provide an edge on which a spacer of sufficient height to mask an etch of feature layer 203 can be formed, yet not so thick as to unnecessarily increase processing time or cost. The preferred thickness of second EDL 205 is between 100 nm and 500 nm.

Figure 2D:
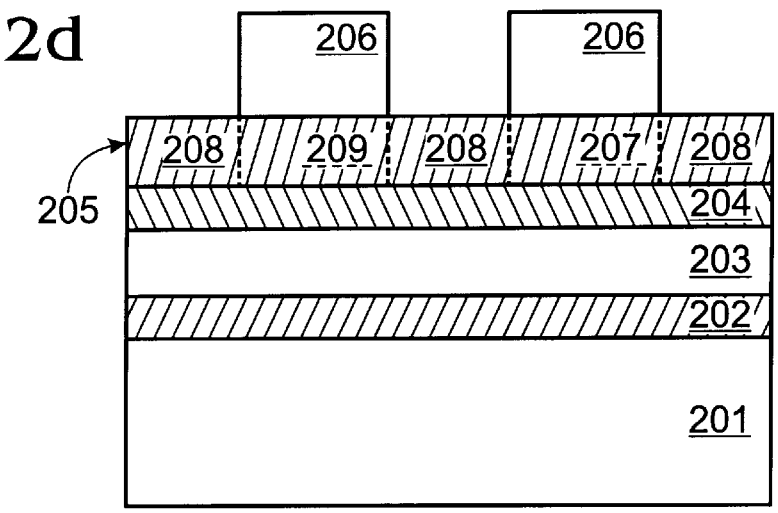
FIG. 2d is an illustration of the wafer of FIG. 2a during the edge definition masking step.

FIG. 2d shows the wafer during edge definition, the first masking step of the process of this embodiment. Edge definition mask 206 has been formed over a first area 207 of second EDL 205, but not over a second area 208 of second EDL 205. Edge definition mask 206 is used to define a pattern in second EDL 205 so that spacers can be formed on the edges of the pattern. In this embodiment, a spacer is used to define the minimum length gate electrode of an MOS transistor. Edge definition mask 206 can also be used to protect areas of second EDL 205 under which feature layer 203 will be preserved to form features that are not of the same length as the gate electrode defined by the spacer. Such features can be, but are not limited to, transistor gate electrodes of greater than minimum length, polysilicon interconnect lines, and polysilicon contact pads. For example, in FIG. 2d, edge definition mask 206 has also been formed over a third area 209 of second EDL 205. Edge definition mask 206 is preferably formed from a photoresist material using conventional photolithography techniques.

Figure 2E:
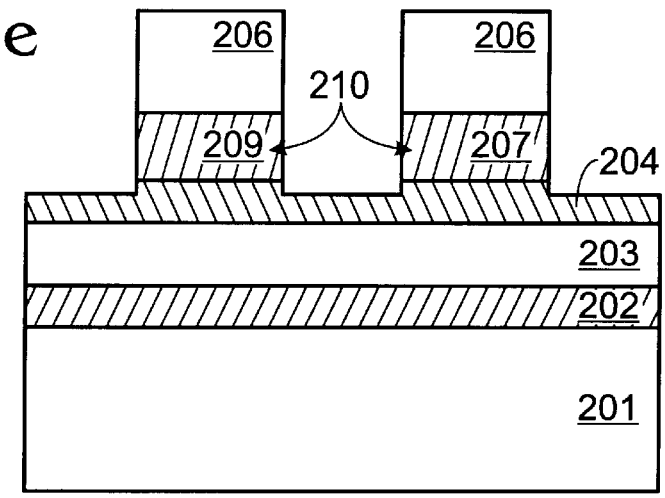
FIG. 2e is an illustration of the wafer of FIG. 2a after a patterned second EDL has been formed.

FIG. 2e shows the wafer after second area 208 of second EDL 205 has been etched away to form a patterned second EDL 210. An anisotropic etch, such as a plasma etch or a reactive ion etch, is preferred so that the resulting edges in second EDL 205 are substantially vertical. The etch can remove some or substantially all of the area of first EDL 204 that was under second area 208 of second EDL 205, but preferably does not remove a significant amount of feature layer 203.

Figure 2F:
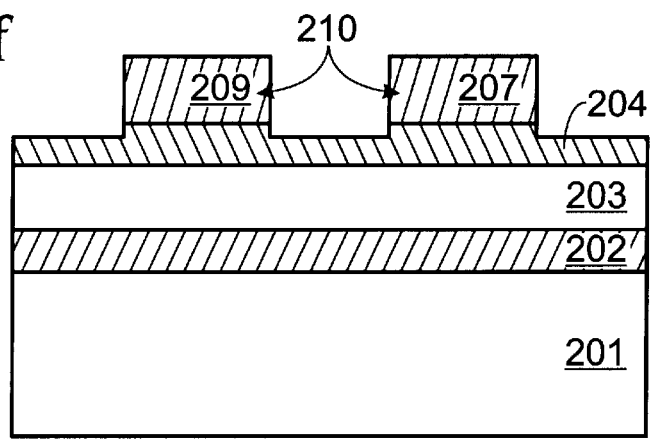
FIG. 2f is an illustration of the wafer of FIG. 2a after the edge definition mask has been removed.

FIG. 2f shows the wafer after edge definition mask 206 has been removed. Techniques for removing conventional photoresist masks are well known.

Figure 2G:
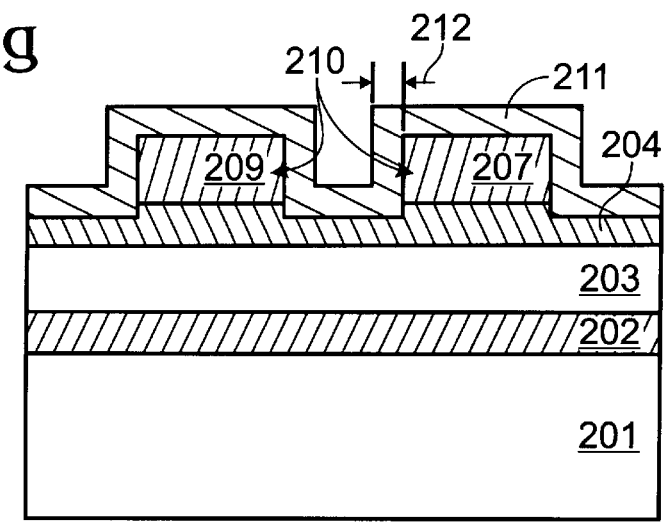
FIG. 2g is an illustration of the wafer of FIG. 2a after a spacer layer has been formed.

FIG. 2g shows the wafer after a spacer layer 211 has been formed. Spacer layer 211 can comprise any material used in semiconductor processing, such as but not limited to insulating materials comprising silicon nitride or silicon dioxide. Spacer layer 211 and first EDL 204 preferably comprise a common material so as to limit process complexity. Therefore, in this embodiment, spacer layer 211 comprises silicon nitride, and preferably comprises primarily silicon nitride. Spacer layer 211 is preferably conformally deposited such that the shape of spacer layer 211 is determined by the shape of the underlying topography. Therefore, the length 212 of spacer layer 211 adjacent to an edge of patterned second EDL 210 is approximately equal to the thickness of spacer layer 211. Consequently, the length of the feature defined by the future spacer will be directly related to the thickness of spacer layer 211. Because conventional photolithography is generally acceptable for defining features with lengths greater than 250 nm, the thickness of spacer layer 211 is preferably below 250 nm and more preferably approximately 100 nm. Spacer layer 211 can be formed using well known techniques such as low pressure chemical vapor deposition.

Figure 2H:
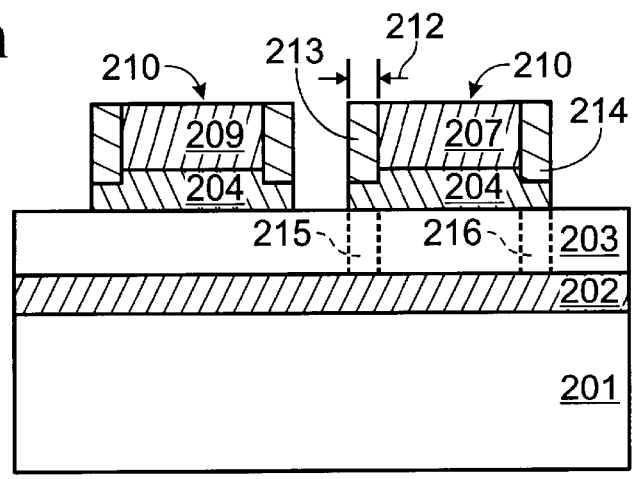
FIG. 2h is an illustration of the wafer of FIG. 2a after spacer etch.

FIG. 2h shows the wafer after spacer etch, which removes substantially all of spacer layer 211 that is not adjacent to an edge of patterned second EDL 210, where spacers such as spacer 213 and spacer 214 are formed. Spacer etch is preferably an anisotropic etch, such as a plasma or a reactive ion etch, so that the length 212 of spacer 213 remains approximately equal to the former thickness of spacer layer 211.

Spacer 213 covers a first area 215 of feature layer 203 that will become the gate electrode of an MOS transistor. Spacer 214, on the other hand, covers a second area 216 of feature layer 203 that will need to be removed in order to prevent the formation of an undesired continuous ring of feature layer material around the perimeter of first area 207 of patterned second EDL 210. Therefore, spacer 214 will be removed during nitride trim, the second and final masking step of the process of the embodiment.

Figures 1, 2I:
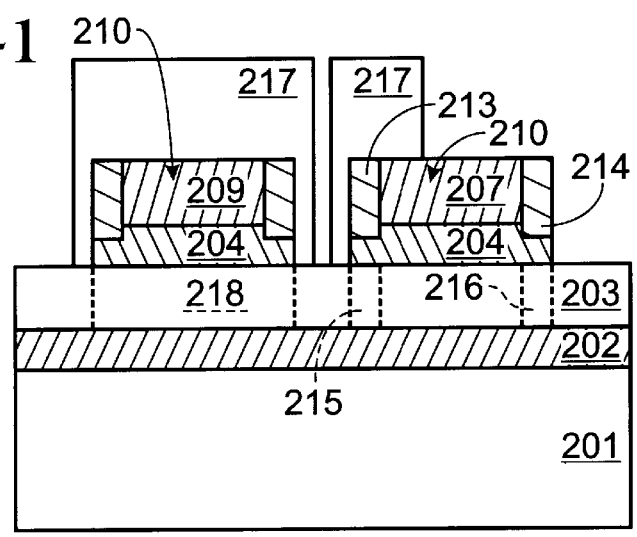
FIG. 2i-1 is an illustration of the wafer of FIG. 2a during the trim mask step.

FIG. 2i-1 shows the wafer during the second masking step. Trim mask 217 has been formed over spacer 213 but not over spacer 214. Trim mask 217 can also be used to protect areas of patterned second EDL 210 under which feature layer 203 will be preserved to form features that are not of the same length as the gate electrode defined by the spacer. Such features can be, but are not limited to, transistor gate electrodes of greater than minimum length, polysilicon interconnect lines, and polysilicon contact pads. For example, in FIG. 2i-1, trim mask 217 has also been formed over a third area 218 of feature layer 203. Trim mask 217 is preferably formed from a photoresist material using conventional photolithography techniques.

Figures 2, 2I:
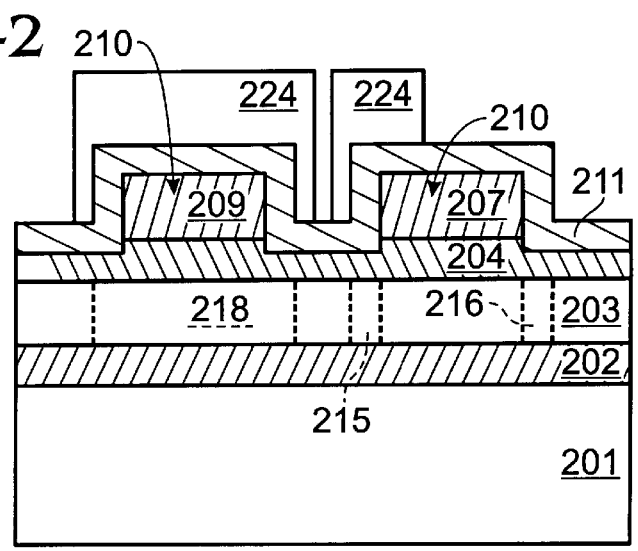
Figures 1, 2J:
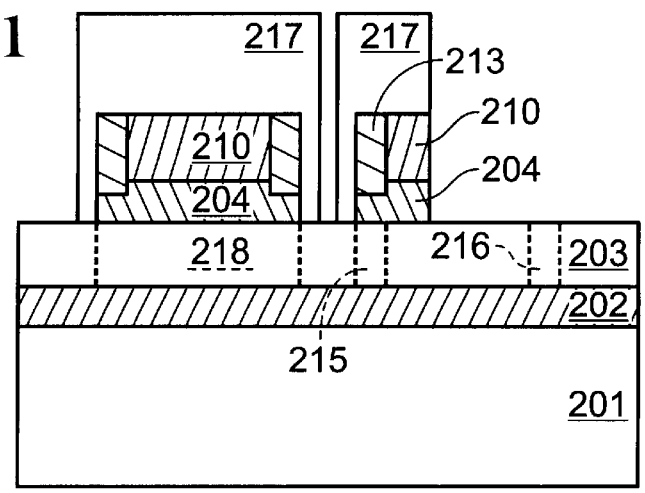
Figures 2, 2J:
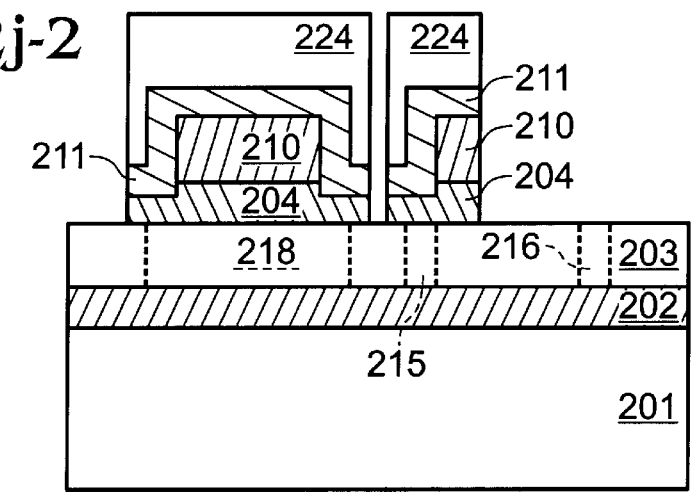

FIG. 2j-1 shows the wafer after trim etch. Trim etch removes spacer 214, and preferably substantially all of patterned second EDL 210 and first EDL 204 that is not covered by trim mask 217. Techniques for performing trim etch are well known.

Figures 1, 2K:
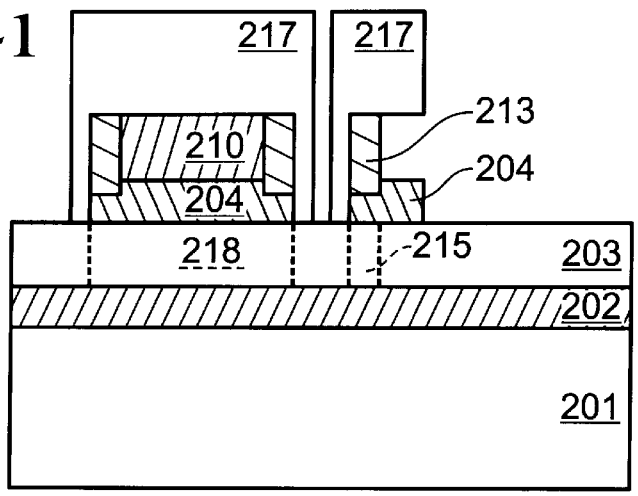
Figures 2, 2K:
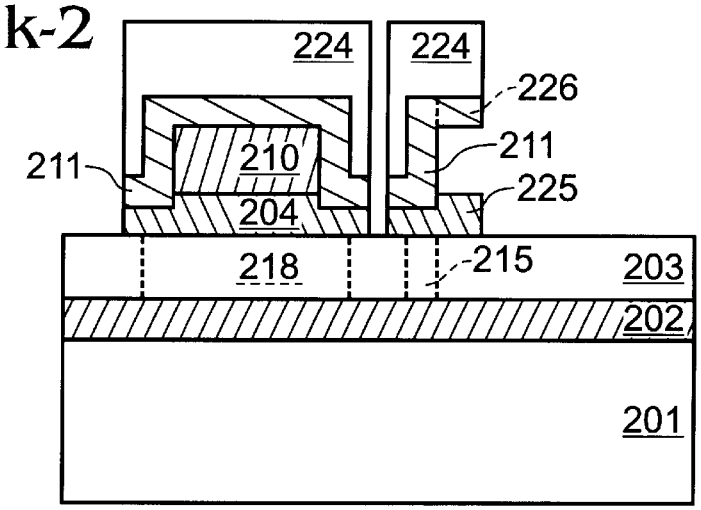

FIG. 2k-1 shows the wafer after an etch of patterned second EDL 210. An isotropic etch, such as a wet etch, is preferred so that substantially all of the material of patterned second EDL 210 that is adjacent to spacer 213 is removed.

Figures 1, 2L:
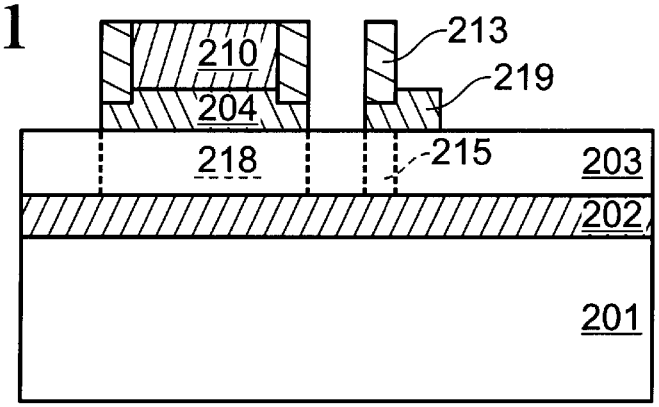
Figures 2, 2L:
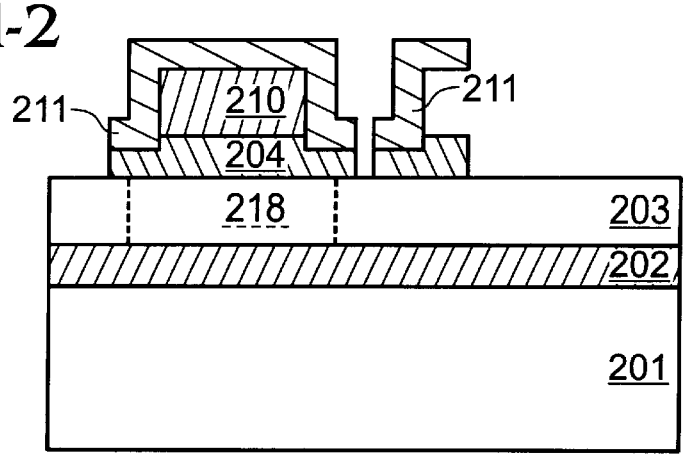

FIG. 2l-1 shows the wafer after trim mask 217 has been removed. Techniques for removing conventional photoresist masks are well known.

Figure 2M:
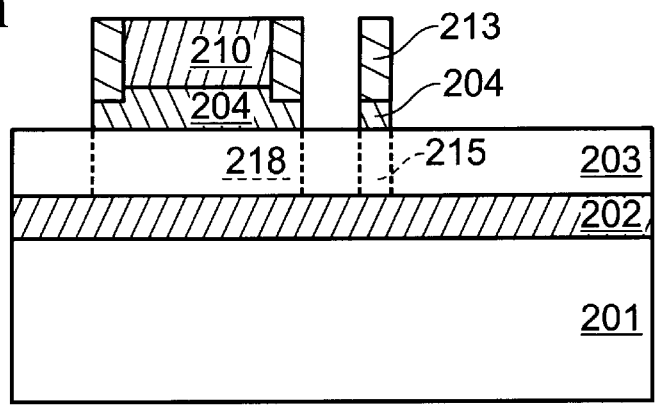
FIG. 2m is an illustration of the wafer of FIG. 2a after any ledges adjacent to spacer are etched away.

FIG. 2l-1 shows a ledge 219 of material from first EDL 204 that was not removed during trim etch. An etch of first EDL 204 is performed to removed ledge 219. An anisotropic etch, such as a plasma or a reactive ion etch, is preferred so that the length 212 of spacer 213 remains approximately equal to the former thickness of spacer layer 211. FIG. 2m shows the wafer after ledge 219 has been etched away.

Figure 2N:
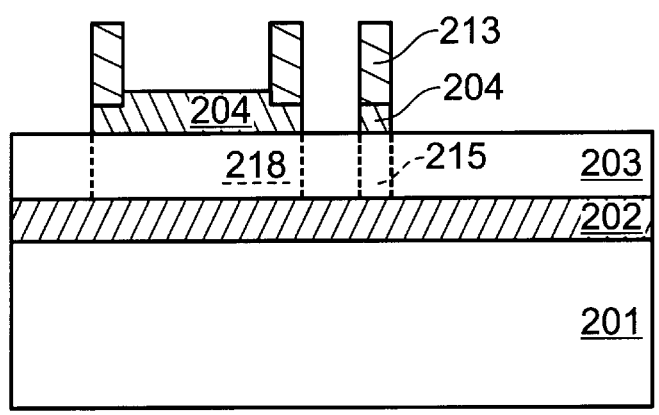
FIG. 2n is an illustration of the wafer of FIG. 2a after an etch of the patterned second EDL.

FIG. 2n shows the wafer after an etch of patterned second EDL 210. An etch in which the rate of removal of the material of patterned second EDL 210 is significantly greater than the rate of removal of first EDL 204 is preferred, so that the etch step removes substantially all of the remainder of patterned EDL 210 while removing little or none of the remainder of first EDL 204. For example, when patterned second EDL 210 is oxide and first EDL 204 is nitride, a wet oxide etch is preferred.

Figure 2O:
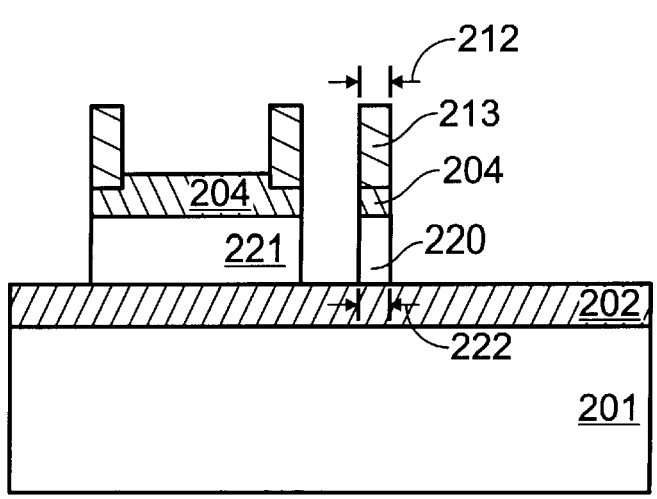
FIG. 2o is an illustration of the wafer of FIG. 2a after an etch of the feature layer.

FIG. 2o shows the wafer after an etch of feature layer 203. Feature 220 has been formed from first area 215 of feature layer 203, and feature 221 has been formed from third area 218 of feature layer 203. An anisotropic etch, such as a plasma or a reactive ion etch, is preferred so that the length 222 of feature 220 is approximately equal to the length 212 of spacer 213.

Figure 2P:
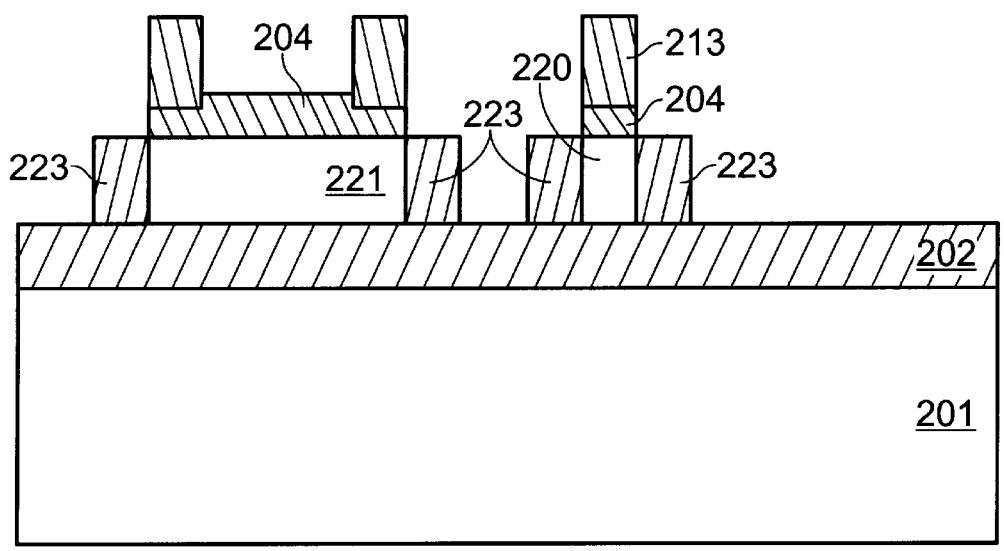
FIG. 2p is an illustration of the wafer of FIG. 2a after a seal layer has been formed.

FIG. 2p shows the wafer after a seal layer 223 has been formed to protect the edges of feature 220 during subsequent processing. Seal layer 223 is preferably a thermally grown oxide.

Figure 2Q:
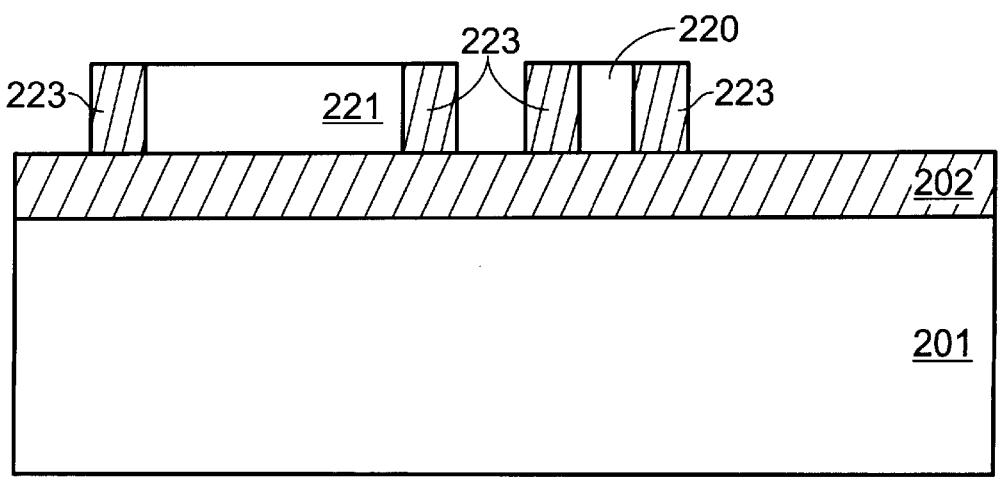
FIG. 2q is an illustration of the wafer of FIG. 2a after the spacer has been etched away.

FIG. 2q shows the wafer after the remainder of spacer layer 211, including spacer 213, and the remainder of first EDL 203 have been etched away. In this embodiment feature 220 is the gate electrode of a future MOS transistor. The remainder of the transistor structure can be formed using conventional MOS processing.

An alternative approach begins with the same flow as that illustrated by FIGS. 2a through 2g. Following the formation of spacer layer 211, however, trim mask 224 is formed as shown in FIG. 2i-2. Next, trim etch removes substantially all of the material of spacer layer 211, patterned second EDL 210, and first EDL 204 that is not covered by trim mask 224. The resulting structure is shown in FIG. 2j-2. Trim etch is followed by an etch of patterned second EDL 210. An isotropic etch is preferred to remove substantially all of the material of patterned second EDL 210 between ledge 225 of first EDL 204 and ledge 226 of spacer layer 211. The resulting structure is shown in FIG. 2k-2. Next, trim mask 224 is removed, resulting in the structure as shown in FIG. 2l-2. Then, an etch is performed to remove substantially all of spacer layer 211 that is not adjacent to an edge of patterned second EDL 210 and then substantially all of first EDL 204 that is not underneath patterned second EDL 210 or what remains of spacer layer 211. An anisotropic etch, such as a plasma or a reactive ion etch, is preferred so that the length 212 of spacer 213 remains approximately equal to the former thickness of spacer layer 211. The resulting structure is shown in FIG. 2m. The alternative approach ends with the same flow as that illustrated by FIGS. 2n through 2q.

In the foregoing specification exemplary embodiments of the invention have been described. The invention is not limited to these embodiments or the details that have been provided to best describe these embodiments. The specification and drawings must be regarded in an illustrative rather than a restrictive sense. The scope of the invention is defined by the following claims.

What is claimed is:

1. A method of fabricating a feature on a substrate comprising:
    forming a feature layer on said substrate;
    forming a first edge definition layer comprising a first material on said feature layer;
    forming a patterned second edge definition layer comprising a second material on said first edge definition layer;
    forming a spacer layer on said patterned second edge definition layer;
    etching said spacer layer to form a spacer adjacent to an edge of said patterned second edge definition layer, said spacer covering a first area of said feature layer;
    etching said patterned second edge definition layer to substantially uncover an area of said first edge definition layer;
    etching said area of said first edge definition layer to substantially uncover a second area of said feature layer; and
    etching said second area of said feature layer to form said feature under said spacer.

2. The method of claim 1 wherein said conductive feature is a transistor gate electrode.

3. A method of fabricating a feature on a substrate comprising:
    forming a feature layer comprising polysilicon on said substrate;
    forming a first edge definition layer comprising silicon nitride on said feature layer;
    forming a second edge definition layer comprising silicon dioxide on said first edge definition layer;
    forming an edge definition mask over a first area of said second edge definition layer;
    etching a second area of said second edge definition layer to form a patterned second edge definition layer;
    removing said edge definition mask;
    forming a spacer layer comprising silicon nitride on said patterned second edge definition layer;
    anisotropically etching said spacer layer to form a spacer adjacent to an edge of said patterned second edge definition layer, said spacer covering a first area of said feature layer;
    forming a trim mask over said spacer;
    isotropically etching said patterned second edge definition layer to substantially uncover an area of said first edge definition layer;
    removing said trim mask;
    anisotropically etching said area of said first edge definition layer to substantially uncover a second area of said feature layer; and
    anisotropically etching said second area of said feature layer to form said feature under said spacer.

4. The method of claim 3 wherein said feature is a transistor gate electrode.

5. The method of claim 3 wherein said edge definition mask is also formed over a third area of said second edge definition layer.

6. The method of claim 3 wherein said trim mask is also formed over a third area of said feature layer.

7. A method of fabricating a feature on a substrate comprising:
    forming a feature layer on said substrate;
    forming a first edge definition layer comprising a first material on said feature layer;
    forming a patterned second edge definition layer comprising a second material on said first edge definition layer;
    forming a spacer layer on said patterned second edge definition layer;
    forming a mask over a first area of said spacer layer, said first area of said spacer layer covering an area of said patterned second edge definition layer, said area of said patterned second edge definition layer comprising an edge of said patterned second edge definition layer;
    etching a second area of said spacer layer to form a first spacer;
    etching said area of said patterned second edge definition layer;
    removing said mask;
    etching said first edge definition layer to form a second spacer comprising at least a portion of said first spacer and at least a portion of said first edge definition layer over a first area of said feature layer; and
    etching a second area of said feature layer to form said feature under said second spacer.

8. The method of claim 7 wherein said first material comprises silicon nitride.

9. The method of claim 7 wherein said second material comprises silicon dioxide.

10. The method of claim 7 wherein said spacer layer comprises silicon nitride.

11. The method of claim 7 wherein said feature layer is conductive.

12. The method of claim 7 wherein said feature layer comprises polysilicon.

13. The method of claim 7 wherein said feature is a transistor gate electrode.

14. The method of claim 7 wherein said mask is also formed over a third area of said spacer layer.

15. A method of fabricating a feature on a substrate comprising:
    forming a feature layer comprising polysilicon on said substrate;
    forming a first edge definition layer comprising silicon nitride on said feature layer;
    forming a second edge definition layer comprising silicon dioxide on said first edge definition layer;
    forming an edge definition mask over a first area of said second edge definition layer;
    etching a second area of said second edge definition layer to form a patterned second edge definition layer;
    removing said edge definition mask;

forming a spacer layer comprising silicon nitride on said patterned second edge definition layer;

forming a trim mask over a first area of said spacer layer, said first area of said spacer layer covering an area of said patterned second edge definition layer, said area of said patterned second edge definition layer comprising an edge of said patterned second edge definition layer;

anisotropically etching a second area of said spacer layer to form a first spacer;

isotropically etching said area of said patterned second edge definition layer;

removing said trim mask;

anisotropically etching said first edge definition layer to form a second spacer comprising at least a portion of said first spacer and at least a portion of said first edge definition layer over a first area of said feature layer; and anisotropically etching a second area of said feature layer to form said feature under said second spacer.

16. The method of claim 15 wherein said feature is a transistor gate electrode.

17. The method of claim 15 wherein said edge definition mask is also formed over a third area of said second edge definition layer.

18. The method of claim 15 wherein said trim mask is also formed over a third area of said spacer layer.

* * * * *